(12) United States Patent
Numaya

(10) Patent No.: US 6,727,622 B2
(45) Date of Patent: Apr. 27, 2004

(54) MOVABLE-MAGNET TYPE METER AND METER DEVICE USING THIS MOVABLE-MAGNET TYPE METER

(75) Inventor: Hiroyasu Numaya, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 0 days.

(21) Appl. No.: 10/168,856

(22) PCT Filed: Oct. 18, 2001

(86) PCT No.: PCT/JP01/09170

§ 371 (c)(1),
(2), (4) Date: Jun. 26, 2002

(87) PCT Pub. No.: WO02/37062

PCT Pub. Date: May 10, 2002

(65) Prior Publication Data

US 2002/0190594 A1 Dec. 19, 2002

(30) Foreign Application Priority Data

Oct. 31, 2000 (JP) ........................................ 2000-337260
Dec. 28, 2000 (JP) ........................................ 2000-399788

(51) Int. Cl.$^7$ ................................................ H02K 21/12
(52) U.S. Cl. ............................... 310/156.38; 310/49 R
(58) Field of Search ........................... 310/49 R, 156.48, 310/156.08, 156.64, 156.43, 156.38

(56) References Cited

U.S. PATENT DOCUMENTS 4,782,353 A * 11/1988 Ogihara et al. ............. 396/463
5,880,551 A * 3/1999 Prudham .................... 310/254
6,043,574 A * 3/2000 Prudham .................... 310/49 R
6,388,346 B1 * 5/2002 Lopatinsky et al. .......... 310/63

FOREIGN PATENT DOCUMENTS

| JP | 53-87692 | 8/1978 |
| JP | 4-88864 | 8/1992 |
| JP | 8-251902 | 9/1996 |
| JP | 2001-289876 | 10/2001 |

* cited by examiner

Primary Examiner—Dang Le
(74) Attorney, Agent, or Firm—McDermott, Will & Emery

(57) ABSTRACT

The invention provides a movable magnet type instrument able to reduce cost and an instrument device using this movable magnet type instrument. The movable magnet type instrument M1 has a rotor magnet 1 magnetized such that adjacent magnetic poles are poles different from each other; a pair of coils 5, 6 arranged around this rotor magnet 1 and having winding central axes C1, C2 crossing each other without being perpendicular to each other; control means 120 for processing an input signal based on a measured amount and supplying a driving signal mutually having a different electrical angle to each of the coils 5, 6 and rotating and operating the rotor magnet; and a pointer 9 for rotating the rotor magnet 1 as a driving source; wherein, when the number of magnetic poles of the rotor magnet 1 is set to n and an acute angle formed by crossing the winding central axes C1, C2 is set to r, the acute angle r is set to an angle calculated by 360/2n (n is a multiple of 2 equal to or greater than 4).

6 Claims, 7 Drawing Sheets

100: CONTROL SECTION
110: DRIVING PROCESSING SECTION
130: SENSOR

MOVABLE-MAGNET TYPE METER AND METER DEVICE USING THIS MOVABLE-MAGNET TYPE METER

TECHNICAL FIELD

The present invention relates to a movable magnet type instrument for operating a pointer and an instrument device using this movable magnet type instrument.

BACKGROUND ART

For example, the movable magnet type instrument of a crossing coil type is generally known as an instrument main body applied to an instrument device for a vehicle. Such a movable magnet type instrument is also called as an air core movement, and a rotor magnet magnetized by two poles of N and S poles is stored into a space formed in a housing. A rotor shaft fixed to the rotor magnet is pivoted by the housing. Further, one end of the rotor shaft is projected to the exterior of the housing, and the pointer is mounted. A pair of coils is orthogonally wound around the outer circumference of the housing. Driving signals having electrical angles different from each other, concretely, voltage signals of sine and cosine waves having different phases at the electrical angles are supplied to each coil. The rotor magnet is pivotally rotated by a synthetic magnetic field generated by each coil by this supply of the driving signal. The pointer can be angularly moved in accordance with a measuring amount by controlling the supply of the driving signal to each coil in accordance with a measured amount such as a vehicle speed, an engine rotation.

In such a movable magnet type instrument, a main portion of the movable magnet type instrument is covered with a shield case constructed by a magnetic material such as an iron nickel alloy such that no rotor magnet magnetized by the two poles is influenced by earth magnetism.

In the above movable magnet type instrument, the shield case constructed by the magnetic material such as the iron nickel alloy is required in consideration of magnetic interference with the rotor magnet, etc., magnetic efficiency, etc. Therefore, the number of parts cannot be reduced and it is difficult to reduce cost since the magnetic material such as the iron nickel alloy forming the shield case is expensive.

Further, in the instrument device called a combination meter, plural movable magnet type instruments mentioned above are particularly arranged. Therefore, the cost of the above movable magnet type instrument is further added to the cost of the instrument device as it is, so that the cost of the instrument device is increased.

In view of this point, a main object of the present invention is to provide a movable magnet type instrument able to reduce cost and an instrument device using this movable magnet type instrument.

DISCLOSURE OF THE INVENTION

The present invention resides in a movable magnet type instrument comprising a rotor magnet magnetized such that adjacent magnetic poles are poles different from each other; a pair of coils arranged around this rotor magnet and having winding central axes crossing each other without being perpendicular to each other; control means for processing an input signal based on a measured amount and supplying a driving signal mutually having a different electrical angle to each of said coils and rotating and operating said rotor magnet; and a pointer for rotating said rotor magnet as a driving source; wherein, when the number of magnetic poles of said rotor magnet is set to n and an acute angle formed by crossing said winding central axes is set to r, the acute angle r is set to an angle calculated by 360/2n (n is a multiple of 2 equal to or greater than 4).

Further, a protecting cover for protecting said coils and constructed by a nonmagnetic material is arranged.

Further, transmitting means for transmitting rotation of said rotor magnet to said pointer is arranged between said pointer and said rotor magnet, and said pointer is decelerated and rotated through said transmitting means in comparison with said rotor magnet.

The present invention also resides in an instrument device using at least one movable magnet type instrument and comprising a rotor magnet magnetized by at least four magnetic poles or more, a pair of coils arranged around this rotor magnet and having winding central axes crossing each other without being perpendicular to each other, and a pointer rotated with said rotor magnet as a driving source; wherein the instrument device has at least one movable magnet type instrument in which, when the number of magnetic poles of said rotor magnet is set to n and an acute angle formed by crossing said winding central axes is set to r, the acute angle r is set to an angle calculated by 360/2n (n is a multiple of 2 equal to or greater than 4).

Further, a protecting case for protecting said coils and constructed by a nonmagnetic material is arranged in said at least one movable magnet type instrument.

Further, transmitting means for transmitting rotation of said rotor magnet to said pointer and decelerating and rotating said pointer in comparison with said rotor magnet is arranged between said pointer and said rotor magnet in said at least one movable magnet type instrument.

BEST MODE FOR CARRYING OUT THE INVENTION

Figure 1:
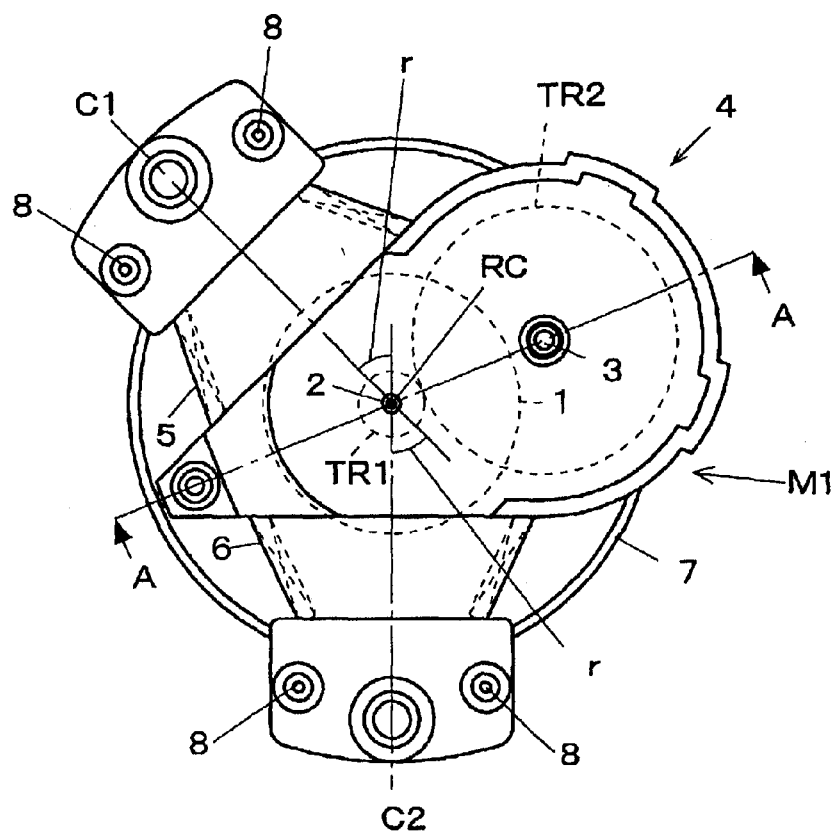
FIG. 1 is a plan view of a movable magnet type instrument in accordance with a first embodiment mode of the present invention.

The embodiment modes of a movable magnet type instrument in the present invention will next be explained on the basis of the accompanying drawings.

A movable magnet type instrument M1 in a first embodiment mode of the present invention has a rotor magnet 1, a first shaft 2 for supporting this rotor magnet 1, a second shaft 3 spaced from this first shaft 2 at a predetermined interval and arranged in a parallel state, a housing 4, a pair of coils 5, 6, a protecting case 7, plural terminals 8, a pointer 9 and a transmitting means TR. The housing 4 supports these first and second shafts 2, 3 by bearings, and stores the rotor magnet 1 and a transmitting mechanism described later. The pair of coils 5, 6 is wound around the outside of this housing 4. The protecting case 7 includes one portion of these coils 5, 6 and covers the outer circumference of a predetermined necessary portion of the housing 4. Respective end portions of the coils 5, 6 are conducted and connected to the plural terminals 8. The pointer 9 is mounted to the tip of the second shaft 3 projected from the housing 4. The transmitting means TR is interposed between the rotor magnet 1 and the pointer 9, and transmits rotation of the rotor magnet 1 to the pointer 9.

Figure 3:
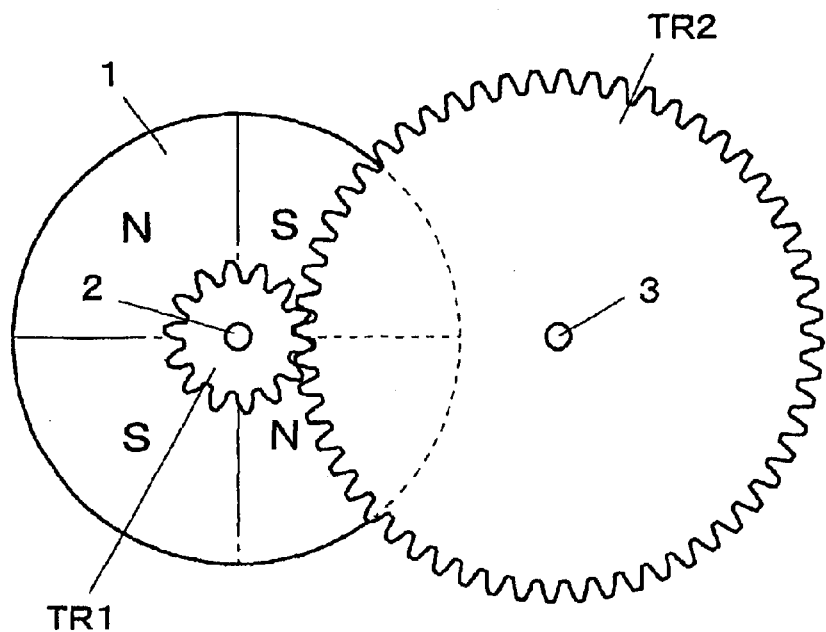
FIG. 3 is a plan view showing a transmitting means.

The rotor magnet 1 is constructed by a plastic magnet of a disk shape in which four magnetic poles in total are magnetized in the radial direction in a mutually equal area ratio of each 1/4 such that the magnetic poles adjacent to each other are set to different poles in N and S poles (see FIG. 3). The rotor magnet 1 is supported by the housing 4 through the first shaft 2 such that the rotor magnet 1 is integrally rotated (associated) with the first shaft 2.

The transmitting means TR is constructed by a first gear TR1 fixed to the first shaft 2 and associated with the rotor magnet 1, and a second gear TR2 connected and engaged with this first gear TR1 and fixed to the second shaft 3 and associated with the second shaft 3. In this embodiment mode, the first gear TR1 is formed such that the first gear TR1 has a diameter smaller than that of the second gear TR2. "14" continuous teeth are formed in the outer circumference of this first gear TR1. The second gear TR2 is formed such that this second gear TR2 has a diameter greater than that of the first gear TR1. "56" continuous teeth are formed in the outer circumference of the second gear TR2.

Figure 2:
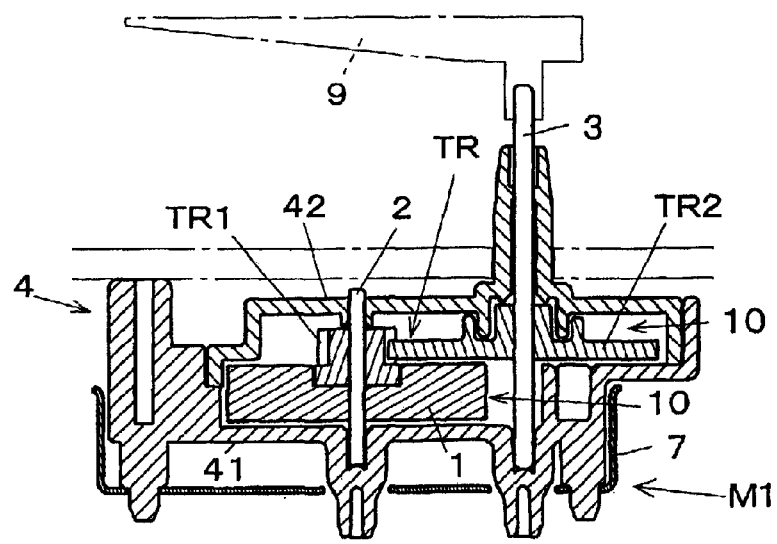
FIG. 2 is a sectional view along an A—A line of FIG. 1.

The housing 4 is formed by synthetic resin, and is divided into a first frame body 41 located on the lower side and a second frame body 42 located on the upper side in FIG. 2. A cavity portion S is formed between the first frame body 41 and the second frame body 42. The rotor magnet 1 and the transmitting means TR are stored into this cavity portion S, and the first and second shafts 2, 3 are pivoted. One end of the second shaft 3 is projected to the exterior from the housing 4, and the pointer 9 is mounted to the tip of the projected end.

Figure 6:
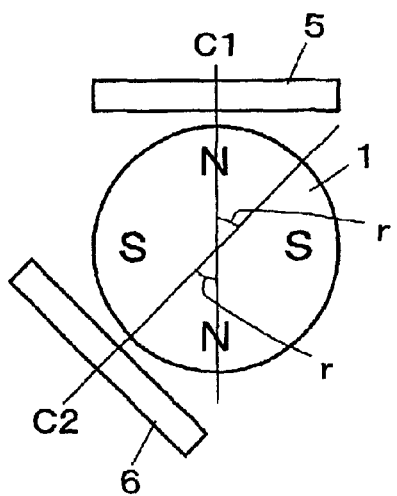
FIG. 6 is an explanatory view showing the relation of a magnetic pole number and an acute angle formed by a winding central axis of the coil in this embodiment mode.

The coils 5, 6 are located in the radial direction outer circumference of the rotor magnet 1 in which no second gear TR2 is arranged. A winding diameter corresponding to the radial circumference face of the rotor magnet 1 is set such that the winding diameter is gradually increased toward the first shaft 2. In this case, winding central axes C1, C2 of the respective coils 5, 6 extend to the first axis 2 side, and cross each other at the rotation center RC of the rotor magnet 1 (intersection point). An acute angle r formed by crossing the respective winding central axes C1, C2 at this time is set to about 45 degrees in this embodiment. The directions of the winding central axes C1, C2 of the respective coils 5, 6 are a magnetic field generating direction in which a magnetic field is-generated from the coils 5, 6. The acute angle r of 45 degrees is an intermediate angle of 90 degrees formed in the coil 5 by an N-pole on the opposite side and one of S-poles adjacent to this N-pole on the opposite side in e.g., the opposite state of the N-poles in the case of the rotor magnet 1 of four poles in this embodiment mode as shown in FIG. 6.

Figure 7:
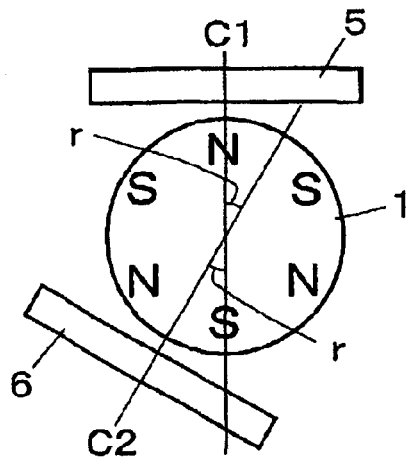
FIG. 7 is an explanatory view showing the relation of the magnetic pole number and the acute angle formed by the winding central axis of the coil in a modified example of this embodiment mode.

For example, as shown in FIG. 7, the acute angle r in the case of the rotor magnet 1 of six poles is 30 degrees as an intermediate angle of 60 degrees formed in the coil 5 by an S-pole located by 180 degrees on the opposite side and one of N-poles adjacent to this S-pole on the opposite side in the opposite state of the N-poles.

Figure 8:
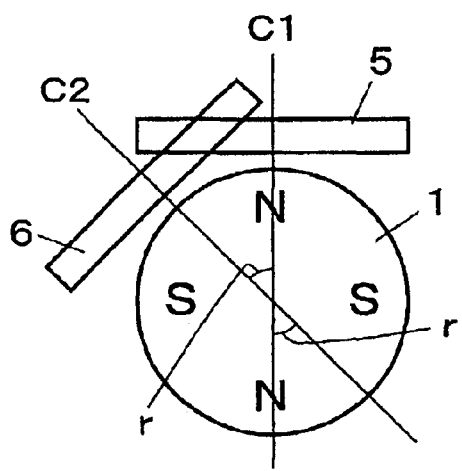
FIG. 8 is an explanatory view showing the relation of the magnetic pole number and the acute angle formed by the winding central axis of the coil in a modified example of this embodiment mode.

The acute angle r of 45 degrees formed by crossing the winding central axes C1, C2 may be also formed by arranging the coils 5, 6 as shown in FIG. 8.

The protecting case 7 of a cup shape is mounted to the housing 4 winding the coils 5, 6 therearound. In this embodiment mode, a predetermined required area of the housing 4 except for an area corresponding to the second gear TR2, i.e., only an area of the housing 4 not including the corresponding area of the second gear TR2 and located on the side opposed to the pointer 9 side is covered with the protecting case 7. The protecting case 7 is formed by aluminum, etc. as a nonmagnetic material and is arranged to protect the coils 5, 6. Thus, cost can be restrained since the protecting case 7 is formed without using an expensive magnetic material. The material of the protecting cover 7 is not limited to aluminum, but may be also formed by synthetic resin.

Figure 4:
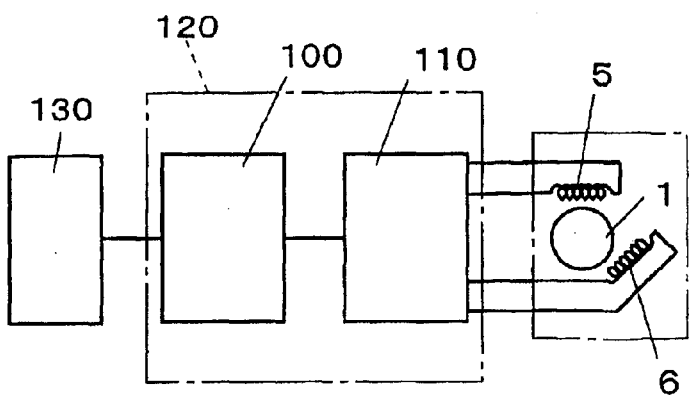
FIG. 4 is a block diagram showing a control means.

As shown in FIG. 4, the movable magnet type instrument M1 constructed in this way is operated by a control means 120 including a control section 100 and a driving processing section 110.

The control section 100 is constructed by a microcomputer. The control section 100 includes a CPU for executing a control program, a ROM for storing the control program, a RAM for temporarily storing arithmetically processed data, an interface (I/F) for inputting a signal from the exterior, and a bus for connecting each of the CPU, the ROM, the RAM and the interface. The control section 100 is arranged on the vehicle body side. In this case, a sensor 130 for detecting rotation of the output shaft of a transmission and outputting a predetermined pulse signal is connected to the control section 100.

When the pulse signal (an input signal based on a measured amount) from this sensor 130 is inputted to the control section 100, the control section 100 arithmetically calculates this pulse signal, and converts this pulse signal to the indicating position of an unillustrated character plate described later. The control section 100 performs processing for calculating indication angle data on this character plate of the pointer 9, and outputs these indication angle data to the driving processing section 110 at the subsequent stage.

Figure 5:
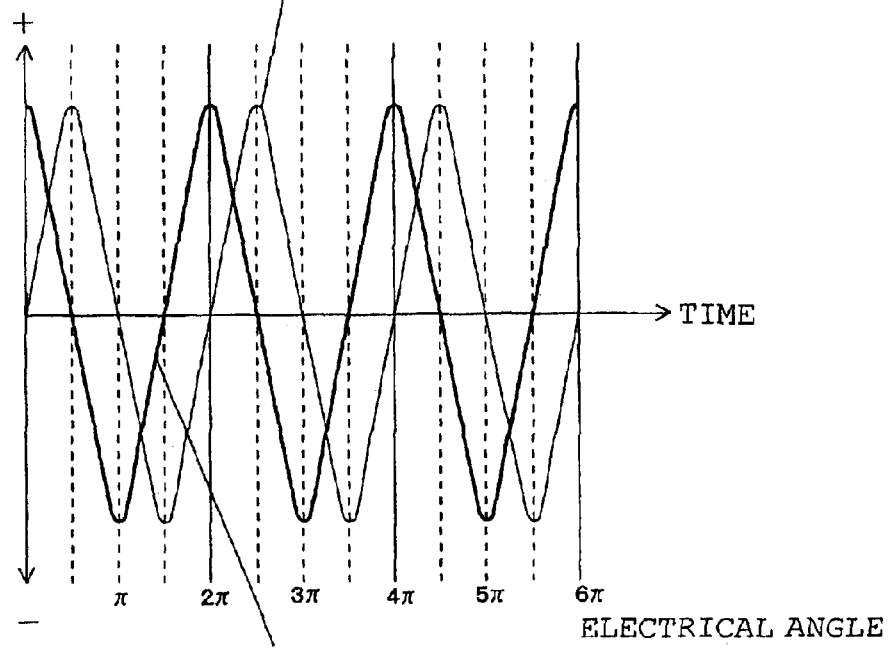
FIG. 5 is a waveform diagram of a driving signal supplied to a coil.

The driving processing section 110 includes a ROM section for storing current flowing amount data of the respective coils 5, 6 according to the above indication angle data, a D/A converting section for converting an output value of each ROM section to an analog amount, and a driving output section for supplying a driving voltage corresponding to this analog amount to each of the coils 5, 6. The above indication angle data from the control section 100 are converted by this driving processing section 110 to a driving signal having a different electrical angle (phase angle), more particularly, a voltage signal of sine and cosine waveforms having different phases at the electrical angle as shown in FIG. 5, or the voltage signal of a waveform close to these waveforms. The converted signal is supplied to each of the coils 5, 6.

Thus, a synthetic magnetic field vector according to the measured amount is formed by each of the coils 5, 6, and the rotor magnet 1 is rotated by an angle according to the measured amount in accordance with this synthetic magnetic field vector. The pointer 9 is also correspondingly rotated and the measured amount is indicated on the above character plate.

In the case of this embodiment mode, the number of first gears TR1 is set to "14", and the number of second gears TR2 is set to "56". The gear ratio of the respective gears TR1, TR2 is set to 1/4. Accordingly, the transmitting means TR functions as a speed reduction transmitting means so that the pointer 9 is decelerated to 1/4 in rotation with respect to the rotor magnet 1. Therefore, the rotor magnet 1 requires a rotation angle four times the angle (rotation angle) of deviation of the pointer 9 to rotate the pointer 9 by a predetermined deviation angle. For example, when an input signal from the sensor 130 corresponds to the deviation angle of 90 degrees in the pointer 9, it is necessary to rotate the rotor magnet 1 at a mechanical angle of 360 degrees. Accordingly, the control means 120 repeatedly supplies twice the driving signal corresponding to the electrical angle of $2\pi$ (one period) to each of the coils 5, 6 as the driving signal for rotating the rotor magnet 1 by the mechanical angle of 360 degrees.

Accordingly, the rotation angle of the rotor magnet 1 obtained by the supply of the driving signal (hereinafter called the signal supply of $2\pi$) corresponding to the electrical angle of $2\pi$ is the mechanical angle of 180 degrees. The deviation angle (rotation angle) of the pointer 9 deviated through the transmitting means TR is similarly the mechanical angle of 45 degrees. The signal supply of $2\pi$ is continuously repeated to obtain the deviation angle of the pointer 9 such as 90 degrees, 135 degrees and 180 degrees greater than 45 degrees.

The influence of the rotor magnet 1 exerted by earth magnetism, etc. can be reduced and the rotor magnet 1 can be operated by the above construction in comparison with the case of two-pole magnetization. Accordingly, the rotor magnet 1 can be operated without covering the rotor magnet 1 with a magnetic material. Therefore, it is sufficient to form the protecting cover 7 by a cheap material instead of the magnetic material to only protect the coils 5, 6 from physical damage, etc. Accordingly, cost can be reduced in comparison with the conventional movable magnet type instrument.

Further, when the driving signal having a different electrical angle is supplied to the pair of coils 5, 6 and the rotor magnet 1 is rotated and operated, it is sufficient to set a magnetic pole number n of the rotor magnet 1 to 4 or more (a natural number (N) multiple of 2 equal to or greater than 4). In this case, it is sufficient that the acute angle r formed by crossing the directions of magnetic fields respectively generated by supplying the driving signal to the pair of coils 5, 6 is about 45 degrees as in this embodiment mode as shown in FIG. 6 in the case of a magnetic pole number "4", and is 30 degrees as shown in FIG. 7 in the case of a magnetic pole number "6". It is sufficient to set the acute angle r to a half (½) of (360 degrees/magnetic pole number n). When the magnetic pole number is "8" although this magnetic pole number 8 is not illustrated in the drawings, it is sufficient to set the acute angle r to 22.5 degrees as a half (½) of (360 degrees/magnetic pole number n).

Figure 9:
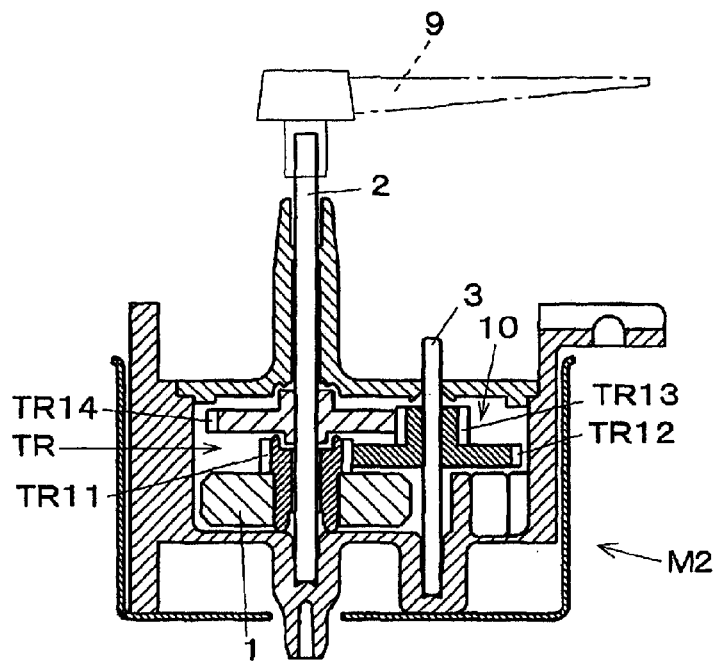
FIG. 9 is a sectional view of a movable magnet type instrument in accordance with a second embodiment mode of the present invention.

Further, in this embodiment mode, the transmitting means TR is constructed by two gears TR1, TR2, but the number of gears constituting the transmitting means TR is arbitrary. For example, the transmitting means TR may be constructed by a first gear TR11, a second gear TR12, a third gear TR13 and a fourth gear TR14 as in a movable magnet type instrument M2 shown in FIG. 9 as a second embodiment mode of the present invention. The first gear TR11 is held by the first shaft 2 together with the rotor magnet 1 so as to be independently rotated, and is rotated in association with the rotor magnet 1. The second gear TR12 is fixed to the second shaft 3, and is rotated together with the second shaft 3. The third gear TR13 is fixed to the second shaft 3 together with this second gear TR12, and is rotated together with the second gear TR12. The fourth gear TR14 is fixed to the first shaft 2 and is rotated together with the first shaft 2. The rotation of the first gear TR11 associated with the rotor magnet 1 is transmitted to the second gear TR12, and the rotation of the second gear TR12 is transmitted to the fourth gear TR14 through the third gear TR13 so that the pointer 9 mounted to the first shaft 2 is operated.

Thus, since the decelerated and rotated transmitting means TR is arranged, it is possible to provide the movable magnet type instrument M2 in which the influence of the rotor magnet 1 exerted by earth magnetism is further restrained, and indication with high accuracy can be performed.

Further, the pointer 9 may be also directly arranged in the first shaft 2 without arranging the transmitting means TR described in each of the above embodiment modes.

In each of the above embodiment modes, the protecting case 7 is arranged. However, when it is not necessary to protect the coils 5, 6, etc., it is not necessary to arrange the protecting case 7. In accordance with such a construction, the number of parts can be reduced. Further cost can be also reduced.

A third embodiment mode of the present invention will next be explained. The same reference numerals are designated in portions equal to or corresponding to those in the above embodiment modes, and their detailed explanations are omitted.

An instrument device 11 of this embodiment mode is usually used in a vehicle such as an automobile, etc., and is called a so-called combination meter, and indicates and displays plural measuring items by one movable magnet type instrument. This instrument device 11 has plural movable magnet type instruments m1 to m4. These movable magnet type instruments m1 to m4 are mounted to a hard circuit substrate 12 constructed by glass epoxy resin, etc.

Movable magnet type instruments m3, m4 are adjacently arranged. One group of these movable magnet type instruments m3, m4, the movable magnet type instrument m1 and the movable magnet type instrument m2 are arranged in a state in which these movable magnet type instruments are separated from each other. The movable magnet type instruments m1, m2 are separated from each other to such an extent that there is no fear that magnetic interference is mutually caused.

Figure 10:
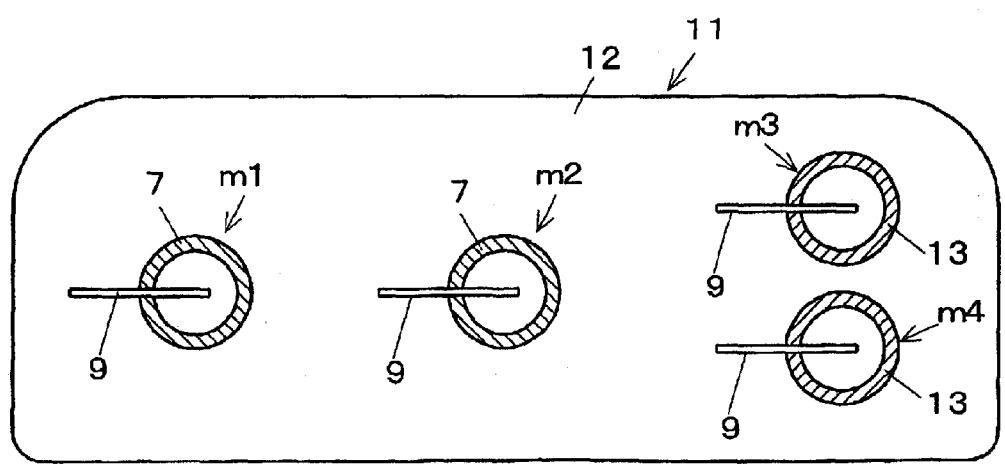
FIG. 10 is a front view of the instrument device of a third embodiment mode.

FIG. 10 simplifies and illustrates the movable magnet type instruments m1, m2, m3 and m4. The movable magnet type instruments m1, m2 have the same construction as the above movable magnet type instrument M1, and have the protecting case 7 formed from a nonmagnetic material such as aluminum. The movable magnet type instruments m3, m4 have the same construction as the fundamental construction of the movable magnet type instrument M1, but differ from the movable magnet type instrument M1 in that a protecting case 13 formed from a magnetic material such as permalloy described later is arranged instead of the protecting case 7 formed from a nonmagnetic material.

The movable magnet type instrument m1 is that of an engine tachometer for indicating and displaying an engine rotation number. The movable magnet type instrument m2 is that of a speedometer for indicating and displaying the speed of a vehicle. The movable magnet type instrument m3 is that of an engine water temperature gauge for indicating and displaying the temperature of cooling water of the engine. The movable magnet type instrument m4 is that of a fuel gauge for indicating and displaying the remaining amount of a fuel such as gasoline, etc. of the vehicle.

A character plate, etc. having a scale and an index portion attached to the scale are normally arranged behind the pointer 9. However, the character plate, etc. are not required in the explanation of this embodiment mode. Accordingly, the character plate and other constructional members are not shown in the drawings.

In the movable magnet type instruments m1, m2, the influence of the rotor magnet 1 exerted by earth magnetism, etc. is small in comparison with the case of two-pole magnetization in the rotor magnet 1. Therefore, the rotor magnet 1 can be operated without using the expensive protecting case 13 constructed by the magnetic material even when no rotor magnet 1 is covered with the protecting case 13. Accordingly, for example, it is sufficient to arrange the protecting case 7 by a cheap material instead of the magnetic material so as to only protect the coils 5, 6 from physical damage, etc. Therefore, cost can be reduced in comparison with the conventional movable magnet type instrument main body.

The movable magnet type instrument m3 used in this embodiment mode will next be explained. The movable magnet type instrument m4 has a structure similar to that of the movable magnet type instrument m3. Therefore, an explanation with respect to the movable magnet type instrument m4 is omitted.

The movable magnet type instruments m3 and m4 are arranged in positions close to each other so that the movable magnet type instruments m3 and m4 are influenced by mutual magnetic fields of the rotor magnet 1. Therefore, the protecting case 13 is formed by a magnetic material.

Manufacture cost of the instrument device 11 can be reduced as described above by using the movable magnet type instruments m1, m2 requiring no protecting case 13 constructed by an expensive magnetic material in the instrument device 11 of this embodiment mode. The manufacture cost can be particularly further reduced in the instrument device 11 using many movable magnet type instruments.

Figure 11:
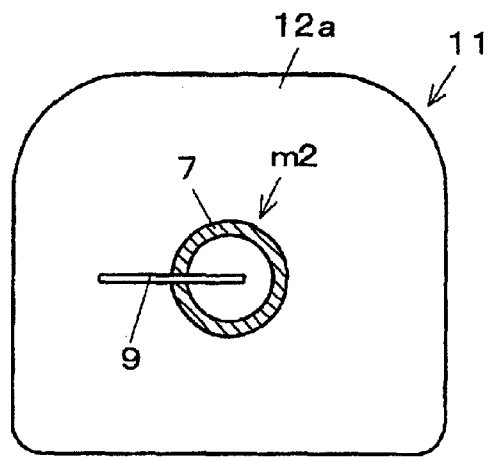
FIG. 11 is a front view of the instrument device of a fourth embodiment mode.

A fourth embodiment mode will next be explained on the basis of FIG. 11. Portions equal to or corresponding to those in the above embodiment modes are designated by the same reference numerals, and their detailed explanations are omitted.

In this embodiment mode, the instrument device 11 has one movable magnet type instrument m2 constituting the speedometer of the above embodiment modes in a circuit substrate 12a comparatively compact in comparison with the circuit substrate 12 of the above third embodiment mode. Such an instrument device 11 indicates and displays only the speed of a vehicle, and is applied as a comparatively cheap instrument device 11. In such an instrument device 11, no movable magnet type instrument m2 has the expensive protecting case 13 constructed by a magnetic material. Therefore, manufacture cost can be reduced by adopting the present invention in comparison with the use of the conventional instrument device 11.

Figure 12:
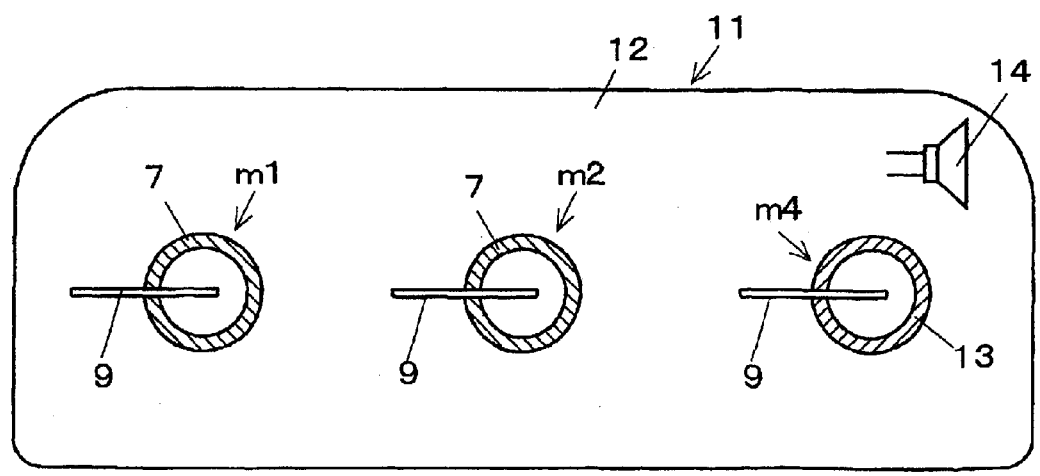
FIG. 12 is a front view of the instrument device of a fifth embodiment mode.

A fifth embodiment mode will next be explained on the basis of FIG. 12. Portions equal to or corresponding to those in each of the above embodiment modes are designated by the same reference numerals, and their detailed explanations are omitted.

In this embodiment mode, the instrument device 11 has the same movable magnet type instruments m1, m2, m4 as the above third embodiment mode in the circuit substrate 12. In this instrument device 11, parts such as a speaker 14 using the magnetic material are mounted to the circuit substrate 12. When the movable magnet type instrument m4 must be arranged in the vicinity of the parts, etc. using such a magnetic material, the movable magnet type instrument m4 having the protecting case 13 constructed by the magnetic material is used. In this embodiment mode, the remaining amount of a fuel is indicated and displayed by only a fuel gauge for indicating and displaying the remaining amount, and engine water temperature is displayed by using an unillustrated light source, e.g., a light emitting diode, etc. Accordingly, an engine water temperature gauge is constructed by only the movable magnet type instrument m4.

As mentioned above, when the movable magnet type instrument m4 having the protecting case 13 constructed by the magnetic material is used only in the vicinity of parts, etc. using the magnetic material and is arranged in a position separated from the parts using the magnetic material, manufacture cost of the instrument device 1 can be reduced by using the movable magnet type instruments m1, m2 having the protecting case 7 constructed by a nonmagnetic material. The manufacture cost can be particularly further reduced in the instrument device 11 using many movable magnet type instruments.

Figure 13:
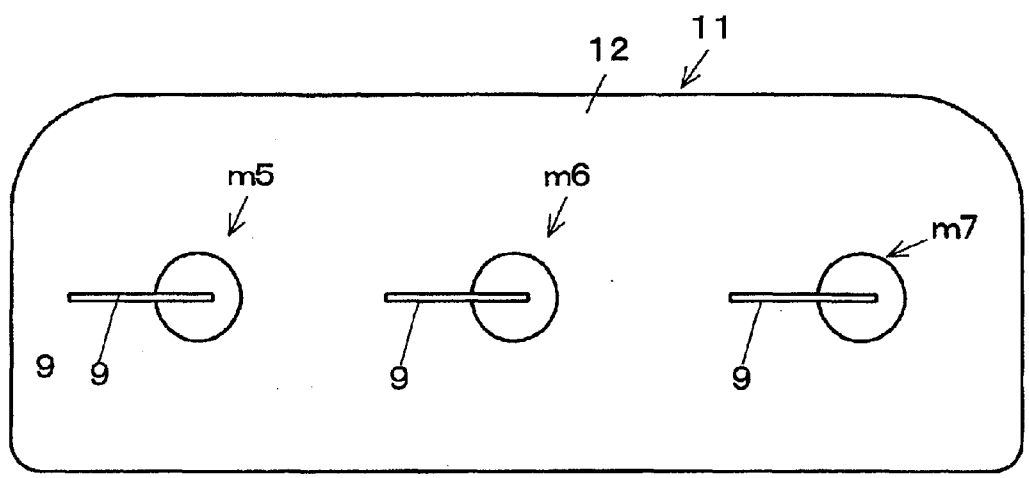
FIG. 13 is a front view of the instrument device of a sixth embodiment mode.

A sixth embodiment mode will next be explained on the basis of FIG. 13. Portions equal to or corresponding to those in each of the above embodiment modes are designated by the same reference numerals, and their detailed explanations are omitted.

The instrument device 11 of this embodiment mode has plural movable magnet type instruments m5 to m7. The movable magnet type instruments m5 to m7 differ from the movable magnet type instruments m1 to m4 of the above third to fifth embodiment modes in that the movable magnet type instruments m5 to m7 have no protecting cases 7, 16 themselves.

These movable magnet type instruments m5 to m7 are mounted to the hard circuit substrate 12. The movable magnet type instrument m5 is that of an engine tachometer for indicating and displaying an engine rotation number. The movable magnet type instrument m6 is that of a speedometer for indicating and displaying the speed of a vehicle. The movable magnet type instrument m7 is that of a fuel gauge for indicating and displaying the remaining amount of a fuel such as gasoline of the vehicle, etc.

It is not necessary to protect the coils 5, 6 of the movable magnet type instruments m5 to m7 so that it is not necessary to arrange the protecting cases 7, 16. In accordance with such a construction, the number of parts can be reduced so that cost can be further reduced.

INDUSTRIAL APPLICABILITY

The present invention can provide a movable magnet type instrument able to reduce cost so that the present invention can be utilized to reduce the cost of an instrument device using the movable magnet type instrument.

What is claimed is:
1. A movable magnetic type instrument comprising a rotor magnet magnetized such that adjacent magnetic poles are poles different from each other; a pair of coils arranged around this rotor magnet and having winding central axes crossing each other at a rotation center of the rotor magnet without being perpendicular to each other; control means for processing an input signal based on a measured amount and supplying a driving signal mutually having a different electrical angle to each of said coils and rotating and operating said rotor magnet; and a pointer rotated by said rotor magnet as a driving source; wherein, when the number of magnetic poles of said rotor magnet is set to n and an acute angle formed by crossing said winding central axes at said rotation center of said rotor magnet is set to r, the acute angle r is set to an angle calculated by 360/2n (n is a multiple of 2 equal to or greater than 4).

2. A movable magnet type instrument according to claim 1, wherein a protecting cover for protecting said coils and constructed by a nonmagnetic material is arranged.

3. A movable magnet type instrument according to claim 1, wherein transmitting means for transmitting rotation of said rotor magnet to said pointer is arranged between said pointer and said rotor magnet, and said pointer is decelerated and rotated through said transmitting means in comparison with said rotor magnet.

4. An instrument device using at least one movable magnetic type instrument and comprising a rotor magnet magnetized by at least four magnetic poles or more, a pair of coils arranged around this rotor magnet and having winding central axes crossing each other at a rotation center of the rotor magnet without being perpendicular to each other, and a pointer rotated with said rotor magnet as a driving source; wherein the instrument device has at least one movable magnet type instrument in which, when the number of magnetic poles of said rotor magnet is set to n and an acute angle formed by crossing said winding central axes at said rotation center of said rotor mannet is set to r, the acute angle r is set to an angle calculated by 360/2n (n is a multiple of 2 equal to or greater than 4).

5. An instrument device using the movable magnet type instrument according to claim 4, wherein a protecting case for protecting said coils and constructed by a nonmagnetic material is arranged in said at least one movable magnet type instrument.

6. An instrument device using the movable magnet type instrument according to claim 4, wherein transmitting means for transmitting rotation of said rotor magnet to said pointer and decelerating and rotating said pointer in comparison with said rotor magnet is arranged between said pointer and said rotor magnet in said at least one movable magnet type instrument.

* * * * *